(12) United States Patent
Garg et al.

(10) Patent No.: US 8,101,476 B2
(45) Date of Patent: Jan. 24, 2012

(54) STRESS MEMORIZATION DIELECTRIC OPTIMIZED FOR NMOS AND PMOS

(75) Inventors: Kanan Garg, Plano, TX (US); Haowen Bu, Plano, TX (US); Mahalingam Nandakumar, Richardson, TX (US); Song Zhao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 12/541,335

(22) Filed: Aug. 14, 2009

(65) Prior Publication Data

US 2010/0210081 A1 Aug. 19, 2010

Related U.S. Application Data

(60) Provisional application No. 61/089,117, filed on Aug. 15, 2008.

(51) Int. Cl.
*H01L 21/8238* (2006.01)

(52) U.S. Cl. ............... 438/199; 438/792; 257/E21.293; 257/E21.634

(58) Field of Classification Search .................. 438/199, 438/792; 257/E21.293, E21.634
See application file for complete search history.

(56) References Cited

U.S. PATENT DOCUMENTS

| | | | |
|---|---|---|---|
| 2005/0263825 A1* | 12/2005 | Frohberg et al. | 257/369 |
| 2006/0246672 A1* | 11/2006 | Chen et al. | 438/301 |
| 2008/0023771 A1* | 1/2008 | Romero et al. | 257/369 |
| 2009/0298297 A1* | 12/2009 | Kanarsky et al. | 438/761 |

* cited by examiner

*Primary Examiner* — Tuan N. Quach
(74) *Attorney, Agent, or Firm* — Jacqueline J. Garner; Wade J. Brady, III; Frederick J. Telecky, Jr.

(57) ABSTRACT

A method for forming a tensile SiN stress layer for stress memorization enhancement of NMOS transistors with a high Si—H/N—H bond ratio that does not degrade PMOS transistors. A CMOS integrated circuit is processed through a NMOS source and drain implant but not through NMOS source and drain anneal. A SiN dielectric layer is deposited such that an area ratio of a Si—H peak to a N—H peak in a FTIR spectrum is greater than 7 and a tensile stress of the SiN dielectric is greater than 150 MPa. The CMOS integrated circuit is annealed after deposition of the SiN dielectric layer and the SiN dielectric layer is removed from at least a part of the integrated circuit.

12 Claims, 7 Drawing Sheets

STRESS MEMORIZATION DIELECTRIC OPTIMIZED FOR NMOS AND PMOS

CROSS-REFERENCE TO RELATED APPLICATIONS

This application claims the benefit of priority under U.S.C. §119(e) of U.S. Provisional Application 61/089,117, filed Aug. 15, 2008. The following patent application is related and hereby incorporated by reference: U.S. patent application Ser. No. 12/209,270, filed Sep. 21, 2007, U.S. Pat. No. 7,678, 637 issued Mar. 16, 2010.

FIELD OF THE INVENTION

This invention relates to the field of integrated circuits. More particularly, this invention relates to a method of forming a stress memory enhancement film and related structure.

BACKGROUND OF THE INVENTION

NMOS transistors in advanced CMOS integrated circuits are frequently enhanced by a process sequence known as stress memorization technique (SMT), in which a layer of tensile material is deposited after the NMOS source and drain (NSD) ion implantation process is performed and before the source and drain anneal. During the anneal, the polycrystalline silicon (poly silicon) in the NMOS gate, which was partially amorphized by the NSD ion implant, recrystallizes with a grain configuration that exerts stress on the underlying NMOS channel when the tensile layer is removed. The resultant strain in the NMOS channel increases the mobility of the charge carriers, which desirably improves the on-state current.

The tensile stress film which is applied to NMOS transistors during SMT to improve NMOS performance is usually removed from PMOS transistors to prevent PMOS degradation. The degradation of the PMOS transistors by SMT is caused by two factors. First, hydrogen in the film enhances boron diffusion in the PMOS source and drain regions which increases short channel effects and also enhances the diffusion of boron through the PMOS gate dielectric into the channel region which also increases short channel effects. Second, PMOS hole carrier mobility is degraded by tensile stress. Short channel effects increase PMOS transistor standby power which is undesirable. Removing SMT from the PMOS transistors to avoid these detrimental effects increases manufacturing cost and cycletime.

SUMMARY OF THE INVENTION

The instant invention teaches a method for forming a stress memorization film with a higher Si—H to N—H bond ratio that may be formed over both NMOS and PMOS transistors and annealed without degradation to the PMOS transistors. In one embodiment the performance of both NMOS and PMOS transistors is improved.

DETAILED DESCRIPTION

Figure 1:
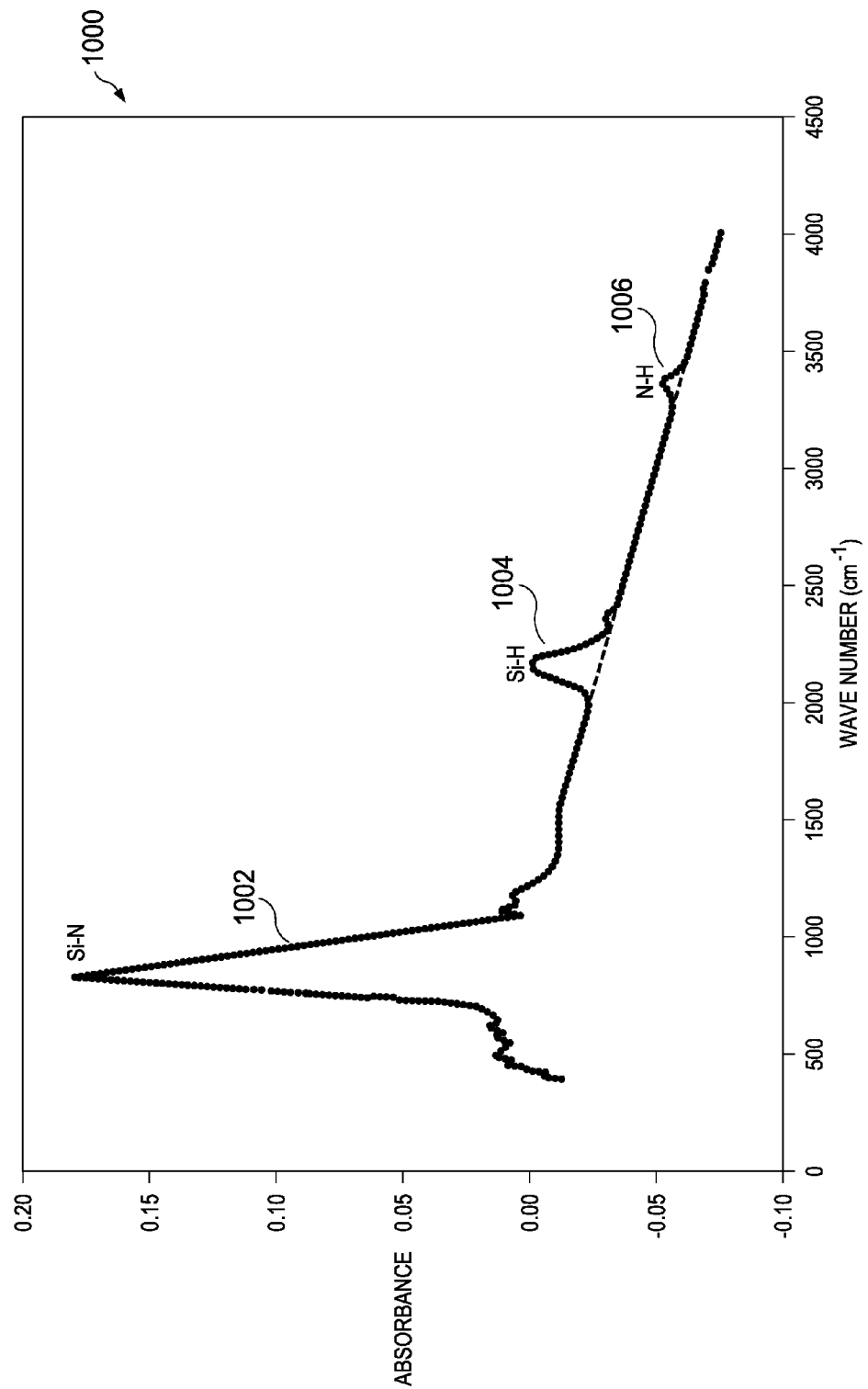
FIG. 1 is an example FTIR spectrum of a silicon nitride film.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Stress memorization (SMT) is commonly used in semiconductor manufacturing to improve the mobility of carriers in the channel of a transistor by applying stress to the channel region. This may be accomplished with polysilicon gates by amorphizing the polysilicon gate, depositing a layer with high stress over the gate and then annealing the gate at a temperature that is sufficient to cause the gate to recrystallize. The high stress in the layer applies stress to the gate material and also to the channel region of the transistor. When the amorphous gate recrystallizes under high stress, it locks in or "memorizes" the stress so that stress continues to be applied by the recrystallized gate to the channel even after the layer with high stress has been removed.

A SMT layer with high tensile stress is most commonly applied to NMOS transistors just prior to source and drain (SD) anneal. The NMOS SD implant which is performed prior to SMT layer deposition amorphizes the polysilicon gate and the SD anneal which is performed after the SMT layer deposition activates the SD implant dopant and at the same time causes the amorphous gate to recrystallize locking in the stress.

While this technique may improve NMOS transistors it typically degrades PMOS transistors because the mobility of hole carriers in PMOS transistors is degraded when tensile stress is applied to the channel and enhanced when compressive stress is applied to the channel. In addition, SiN films contain a significant amount of hydrogen in the form of Si—H and N—H bonds. SiN films with low Si—H:N—H ratios that overlie PMOS transistors cause an enhanced boron diffusion which enhances short channel effects further degrading PMOS transistors. One approach to avoid the tensile SMT layer from degrading the PMOS is to pattern the SMT layer and etch it from the PMOS transistor areas prior to SD anneal. This adds significant manufacturing cost.

The deposition conditions of the SMT film according to the instant invention is given in Table 1. The silicon nitride (SiN) SMT film is deposited using plasma enhanced chemical vapor deposition (PECVD) with reactant gases silane ($SiH_4$) and ammonia ($NH_3$). The $SiH_4$ flow rate may be in the range of 400 to 800 sccm with a preferred flow rate of 600 sccm. The $NH_3$ flow rate may be in the range of 600 to 1200 sccm with a preferred flow rate of 1000 sccm. The $SiH_4/NH_3$ gas ratio may be in the range of 0.4 to 0.75 with a preferred ratio of 0.6 to form a SMT film with an area ratio of Si—H to N—H peaks in the FTIR spectrum greater than 8. Reaction pressure may be in the range of 6 to 10 torr with a preferred pressure of 8 torr. Reaction temperature may be in the range of 300 to 400° C. with a preferred temperature of 350° C. Reaction power may be in the range of 200 to 350 watts with a preferred power of 260 watts.

TABLE 1

Silicon Nitride Recipe

| ITEM | RANGE | Preferred Embodiment | UNITS |
|---|---|---|---|
| Source Power | 200-350 | 260 | watts |
| Pressure | 6-10 | 8 | Torr |
| Temperature | 300-400 | 350 | ° C. |
| $SiH_4$ | 400-800 | 600 | sccm |
| $NH_3$ | 600-1200 | 1000 | sccm |

An example fourier transform infrared spectroscopy (FTIR) spectrum of an SiN film is shown in FIG. 1. The spectrum consists of three major peaks: a Si—N peak (1002) at approximately 800 cm$^{-1}$, a Si—H peak (1004) at approximately 2100 cm$^{-1}$, and a N—H peak (1006) at approximately 3400 cm$^{-1}$. The area under each peak is proportional to the number of bonds in the sample. For example the area of the peak at 800 cm$^{-1}$ is proportional to the number of Si—N bonds in the sample. The absorption coefficient which is the proportionality constant between the number of bonds and the area of the peak may be different for different bonding types so a larger peak may be produced from fewer bonds in the sample if it has a stronger absorption coefficient. In the preferred embodiment the ratio of the area under the Si—H peak (1004) to the area under the N—H peak (1006) is greater than 7 with a preferred ratio greater than 8. The stress for the SMT film may be in the range of 150 to 300 MPa with a preferred stress of 250 MPa.

Figure 2:
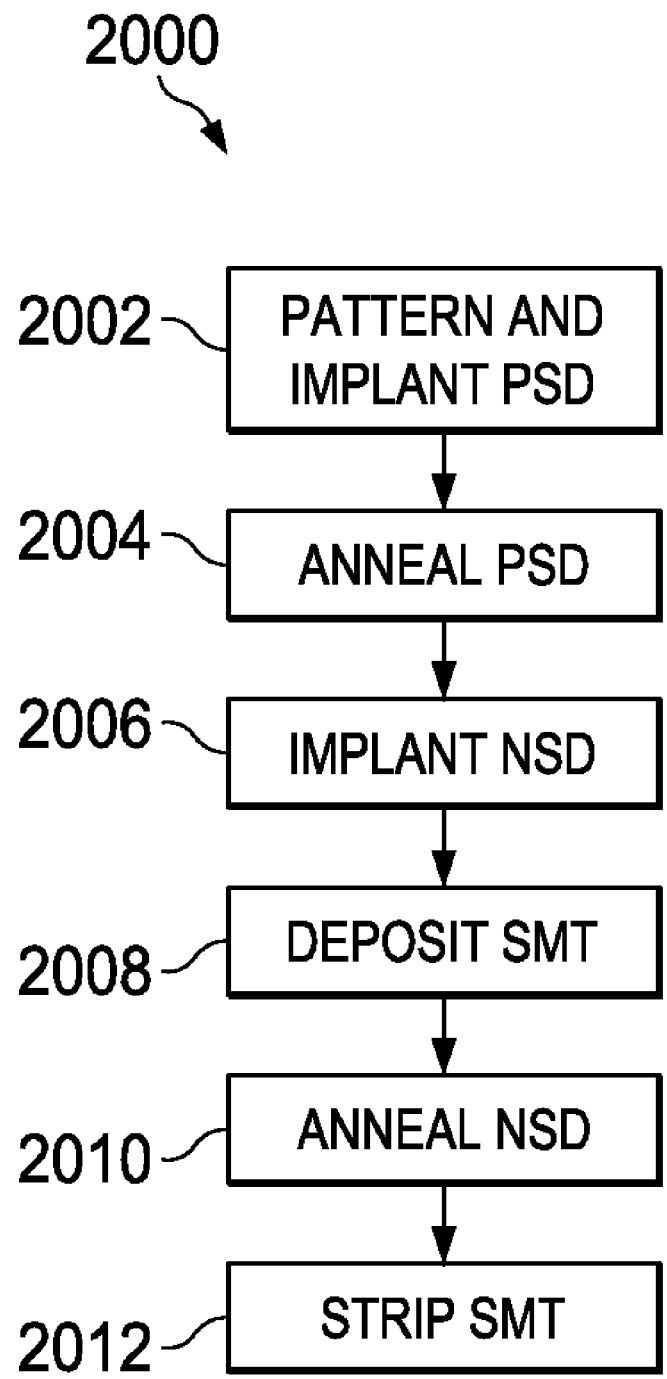
FIG. 2 illustrates a flow diagram of the steps in a stress memorization technique (SMT) process incorporating this invention.

The SMT film according to the instant invention may be incorporated into various process flows such as that described in the commonly assigned patent application having patent application Ser. No. 12/209,270 which is incorporated herein by reference. As illustrated in FIG. 2 (2000) the PMOS source and drain is implanted (step 2002) and annealed (step 2004) to lock the stress into the PMOS gate by crystallizing it prior to implanting the NMOS source and drain. Since the PMOS gate is crystalline when the tensile SMT layer is deposited and annealed, little if any of the tensile stress is transferred to the PMOS gate thus preventing PMOS degradation. The NMOS source and drain implant (step 2006) reamorphizes the polysilicon NMOS gate prior to the tensile SMT layer deposition (step 2008). The amorphization enables stress memorization when the NMOS gate recrystallizes during anneal (step 2010). The SMT is then normally stripped (step 2012) to expose the gates and the source and drains for silicidation.

Figure 3A:
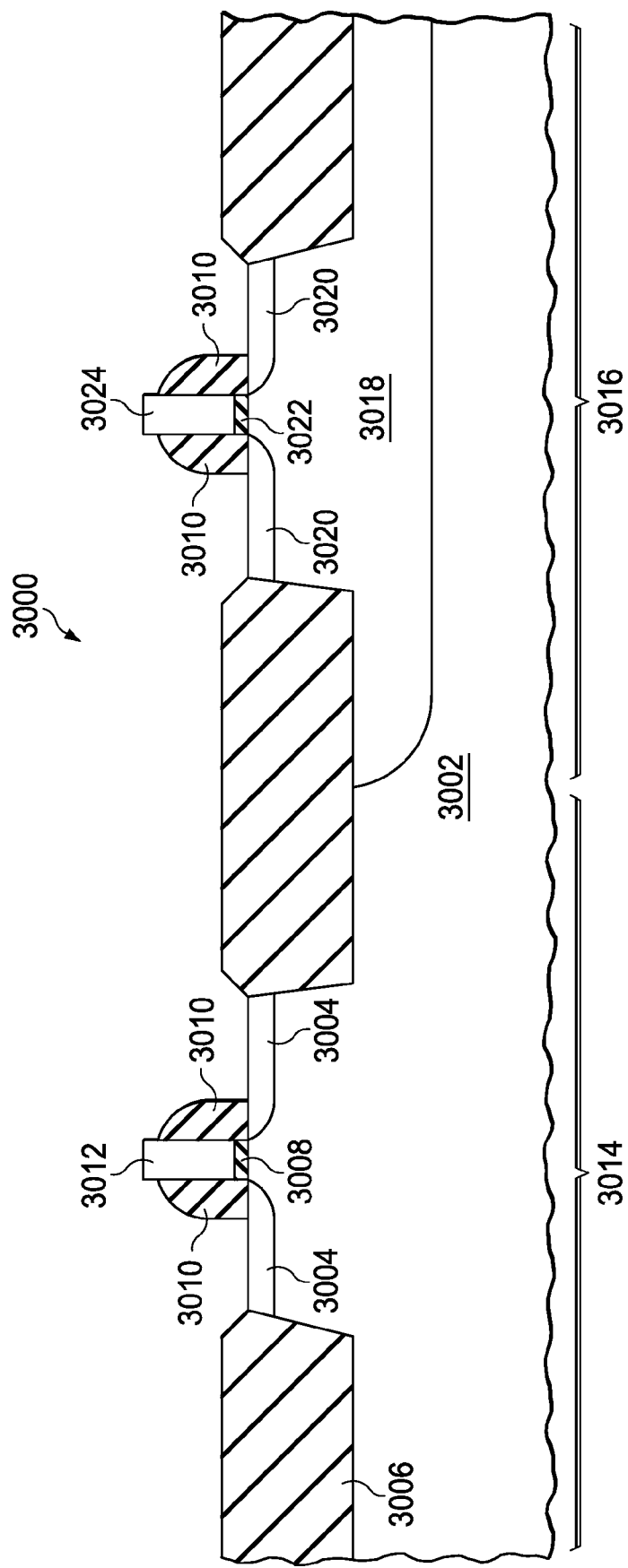
FIG. 3A-3E illustrate the process steps in a SMT process incorporating this invention.

FIGS. 3A through 3E are cross-sectional views of a CMOS integrated circuit during successive stages of fabrication according to a preferred embodiment of the instant invention. FIG. 3A shows a CMOS integrated circuit (3000) that has been partially processed through sidewall formation. The CMOS integrated circuit (3000) includes a substrate (3002), shallow trench isolation (STI) regions (3006), a NMOS transistor region (3014), and a PMOS transistor region (3016). The partially formed NMOS transistor includes a NMOS gate dielectric (3008), an NMOS gate (3012), sidewall spacers (3010), and NMOS source and drain extensions (3004). The partially formed PMOS transistor includes an nwell (3018), a PMOS gate dielectric (3022), a PMOS gate (3024), sidewall spacers (3010) and PMOS source and drain extensions (3020).

Figure 3B:
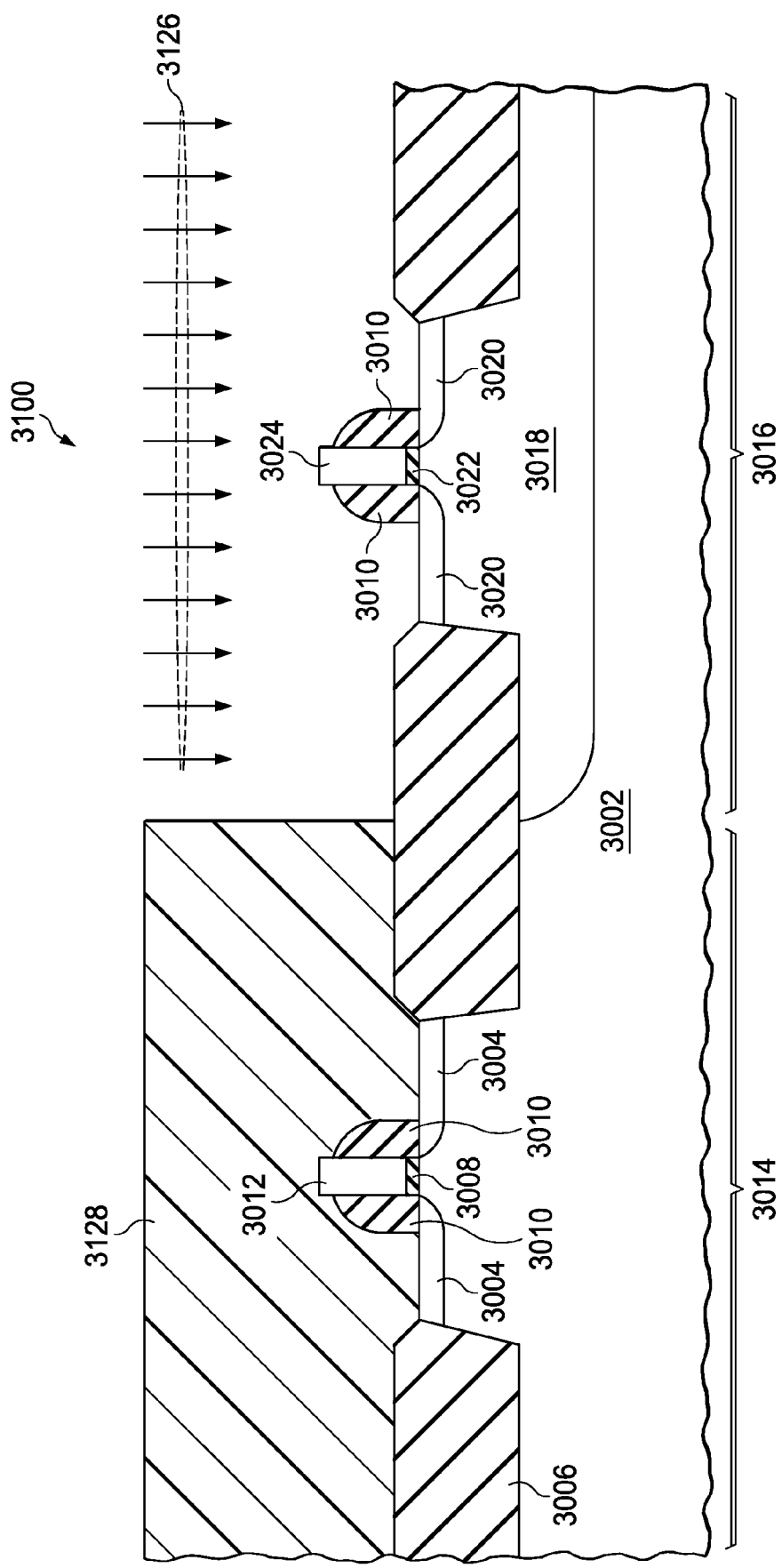

In FIG. 3B, a PSD photoresist pattern (3128) has been formed over the integrated circuit (3100) which blocks the NMOS transistor region (3014) and opens the PMOS region (3016) to the PSD implant (3126).

Figure 3C:
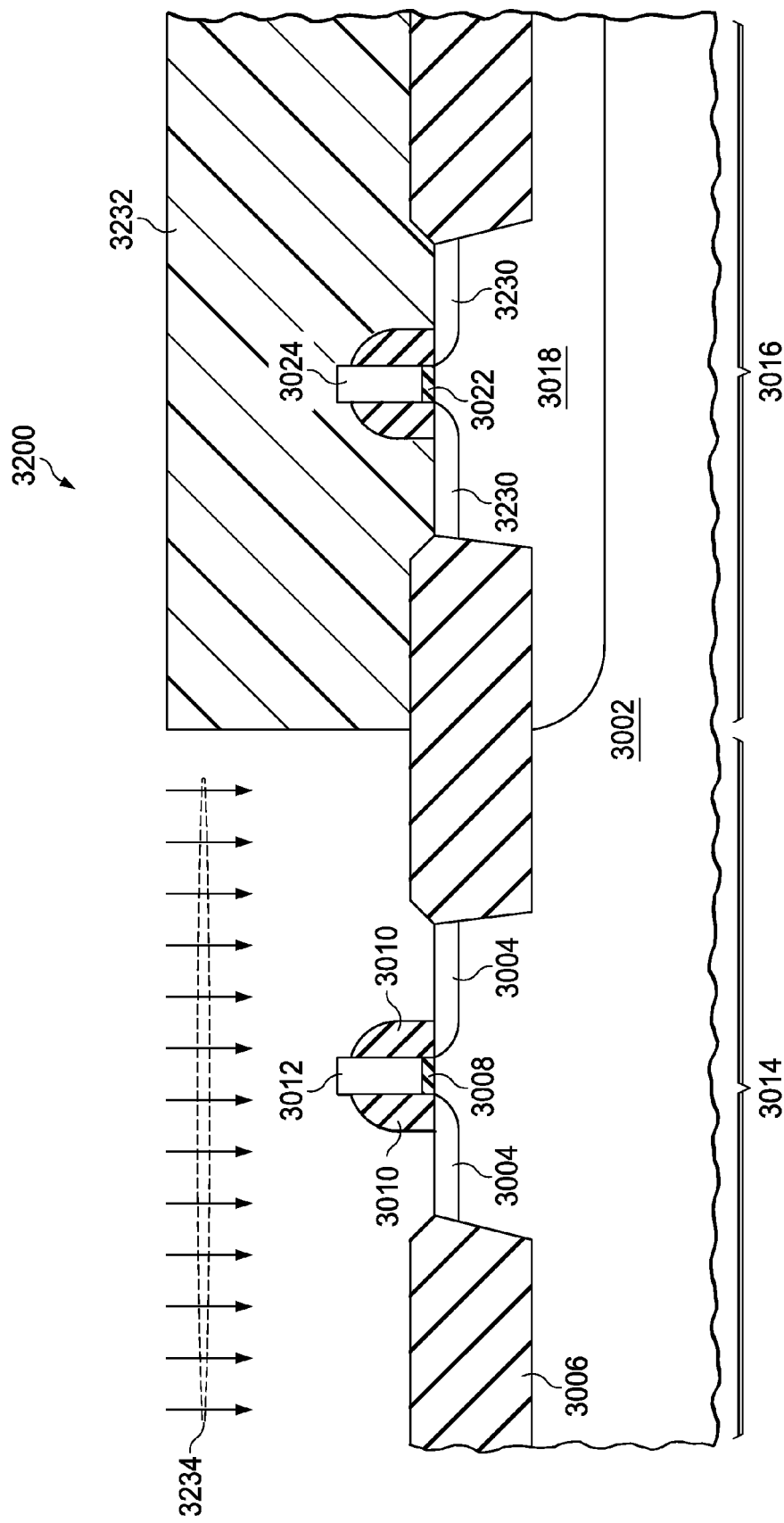

FIG. 3C shows the CMOS integrated circuit (3200) after the PSD photoresist pattern (3126) is removed and the dopant from the PSD implant (3126) is annealed to form the PMOS source and drain junctions (3230). After the PSD anneal, an NSD photoresist pattern (3232) is formed which blocks the PMOS transistor region (3016) and opens the NMOS region (3014) to the NSD implant (3234). The NSD implant (3234) partially amorphizes the polycrystalline NMOS gate material (3012). Since the NSD implant is blocked from the PMOS region (3016), the PMOS gate (3024) remains crystalline.

Figure 3D:
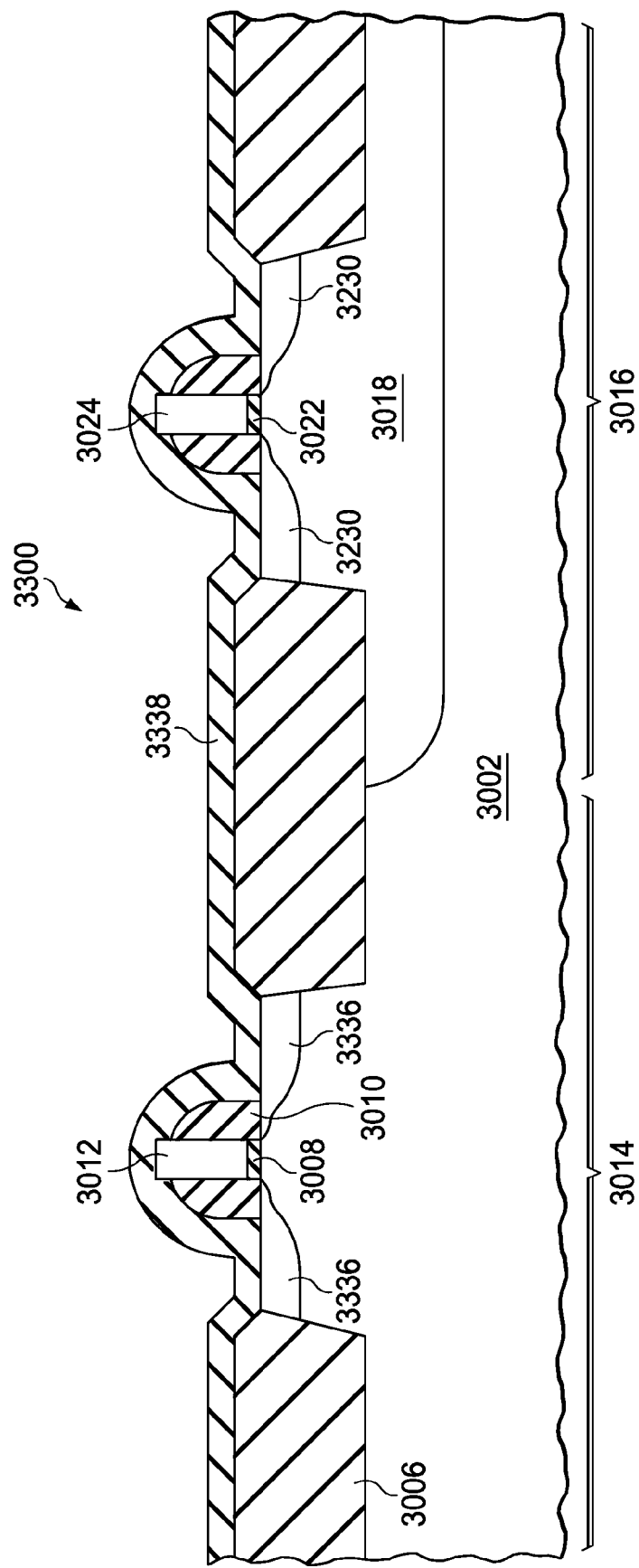

In FIG. 3D, a tensile SMT layer (3338) formed according to a preferred embodiment of the instant invention is deposited over the CMOS integrated circuit (3300). Following the SMT deposition, an anneal is performed to activate the NSD implant (3234) forming NSD junctions (3336) and to recrystallize the NMOS gate under stress from the SMT so that stress from the SMT layer is transferred to the NMOS gate. Typically this anneal may be 900° C. or greater and may also include a millisecond anneal at temperatures that may reach 1100° C. or more. Since the PMOS gate (3024) was already crystalline going into the NSD anneal, effectively no stress is transferred from the SMT layer (3338) to the PMOS gate (4024) thereby avoiding degradation of the PMOS transistor due to stress. In addition, since the Si—H/N—H ratio is greater than 7, enhanced boron diffusion in the source and drain extension regions and through the gate into the channel is suppressed.

Figure 3E:
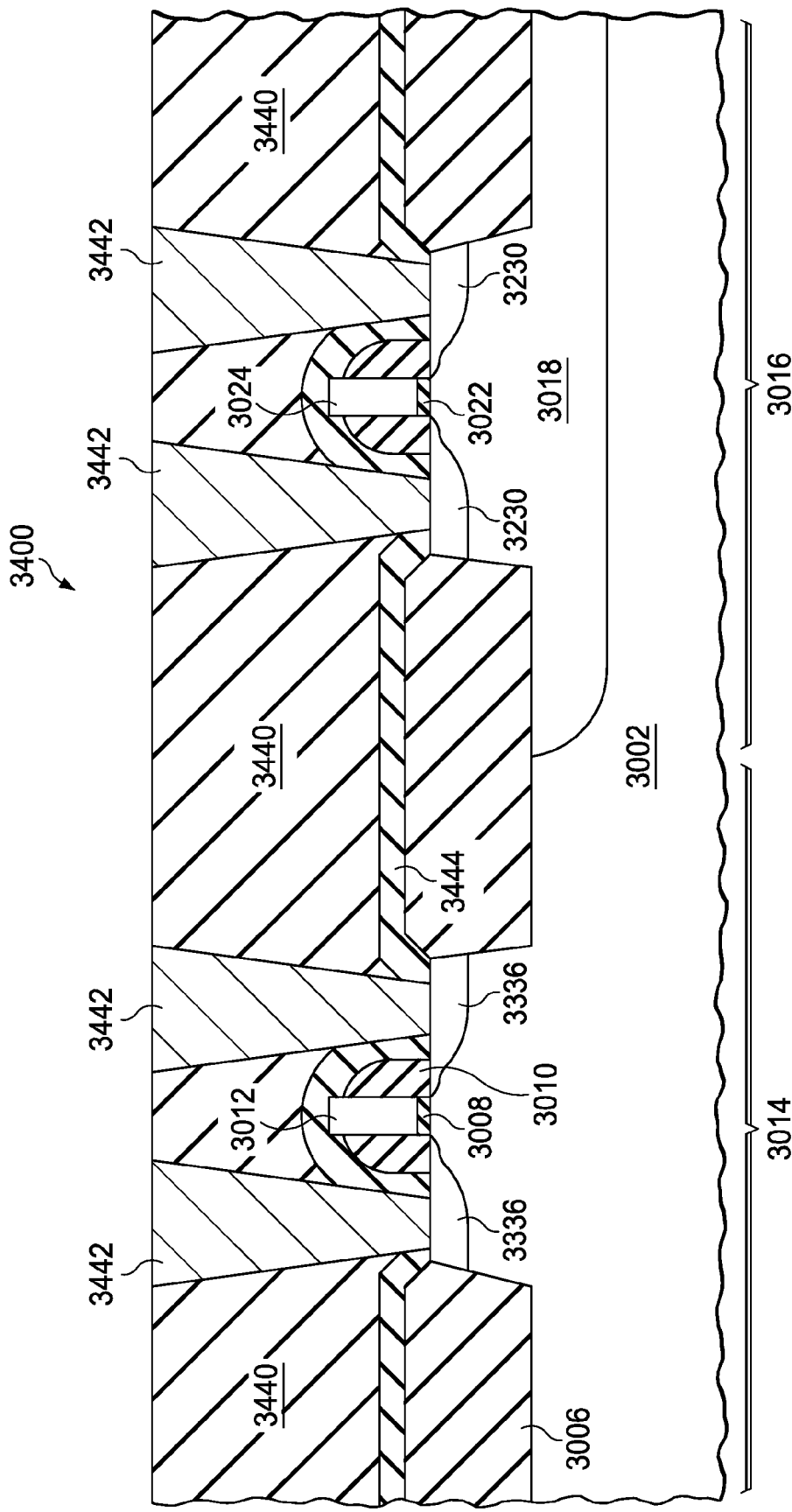

FIG. 3E shows the CMOS integrated circuit after SMT layer (3338) has been removed, contact etch stop layer (3444) and dielectric layer (4440) have been deposited, and contacts (3442) have been formed. A number of process steps such as silicide formation and contact barrier formation and a number of layers such as stress enhancement layers that occur in many conventional process flows have been omitted for clarity. Additional conventional processing to add interconnect layers and passivation layers are performed to complete the CMOS integrated circuit.

In the embodiment described above, the SMT layer (3338) is removed from the integrated circuit, but in some instances the SMT layer (3338) may be patterned to leave a portion of the SMT layer over areas of the circuit such as resistors for example to block silicide formation.

In the embodiment described above, NMOS transistors receive all the benefits of a tensile SMT layer of conventional flows while detrimental effects to PMOS transistors are avoided. PMOS transistors built according to the embodiment described above may have approximately half the off current compared to PMOS transistors built with a conventional SMT layer.

In the process flow described above the PMOS transistor SDs are implanted and annealed prior to implanting the NMOS SDs. Flows in which the both NMOS and PMOS transistors are implanted and not annealed prior to SMT deposition may also benefit with an SMT film formed according to this invention. The high Si—H:N—H ratio may reduce degradation of PMOS transistors by reducing boron diffusion and short channel effects. In a flow where the PMOS gate is recrystallized with tensile SMT covering it, there may be some PMOS degradation due to tensile stress being applied to the PMOS channel region.

While various embodiments of the present invention have been described above, it should be understood that they have been presented by way of example only and not limitation. For example someone skilled in the art may form a film with the instant inventive properties using disilane instead of silane as a react gas. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating an integrated circuit comprising the steps of:
   providing a partially processed CMOS integrated circuit where said integrated circuit has been processed through a NMOS source and drain implant but not through NMOS source and drain anneal;
   depositing a SiN dielectric layer over said partially processed CMOS integrated circuit wherein an area ratio of a Si—H peak to a N—H peak in a FTIR spectrum is greater than 7, wherein a tensile stress of said SiN dielectric is greater than 150 MPa; and
   annealing said partially processed integrated CMOS circuit after deposition of said SiN dielectric layer; and
   removing at said SiN dielectric layer from at least a part of said integrated circuit.

2. The method of claim 1 where a deposition thickness of said SiN dielectric layer is in the range of 20 to 80 nm.

3. The method of claim 1 where a stress of said SiN dielectric layer is in the range of 150 to 250 MPa.

4. The method of claim 1 where said SiN dielectric layer is deposited using PECVD using a silane flow rate is in the range of 400 to 800 sccm, a ammonia flow rate is in the range of 600 to 1200 sccm, and the ratio of said silane flow rate to said ammonia flow rate is in the range of 0.4 to 0.75.

5. The method of claim 4 where said silane flow rate is 600 sccm, said ammonia flow rate is 1000 sccm, said $SiH_4/NH_3$ gas ratio is 0.6, said temperature is 350° C., said pressure is 8 torr, and said power is 260 watts.

6. The method of claim 1 where said SiN dielectric layer is deposited at a temperature in the range 300 to 400° C., a pressure in the range of 6 to 10 torr, and a power in the range of 200 to 350 watts.

7. A method of fabricating an integrated circuit comprising the steps of:
   providing a partially processed CMOS integrated circuit where said integrated circuit has been processed through the formation of sidewall spacers;
   patterning, implanting, and annealing a PSD region on a PMOS device;
   patterning and implanting a NSD region on a NMOS device;
   depositing a SiN dielectric layer over said partially processed CMOS integrated circuit using a PECVD process with silane and ammonia wherein a flow ratio of said silane to said ammonia is in the range of 0.4 to 0.75 and wherein the area ratio of a Si—H peak to a N—H peak in a FTIR spectrum of said SiN dielectric layer is greater than 7;
   annealing said partially processed integrated CMOS circuit with a temperature of at least 900° C. after deposition of said SiN dielectric layer; and
   removing said SiN dielectric layer from a portion of said integrated circuit.

8. The method of claim 7 where a deposition thickness of said SiN dielectric layer is in the range of 20 to 80 nm.

9. The method of claim 7 where a stress of said SiN dielectric layer is in the range of 150 to 250 MPa.

10. The method of claim 7 where said a flow rate of said silane is in the range of 400 to 800 sccm, a flow rate of said ammonia is in the range of 600 to 1200 sccm.

11. The method of claim 10 where said silane flow rate is 600 sccm, said ammonia flow rate is 1000 sccm, said $SiH_4/NH_3$ gas ratio is 0.6, said temperature is 350° C., said pressure is 8 torr, and said power is 260 watts.

12. The method of claim 7 where said SiN dielectric layer is deposited at a temperature in the range 300 to 400° C., a pressure in the range of 6 to 10 torr and a power in the range of 6 to 10 torr.

* * * * *